US009419102B1

(12) United States Patent
Leobandung

(10) Patent No.: US 9,419,102 B1
(45) Date of Patent: Aug. 16, 2016

(54) METHOD TO REDUCE PARASITIC GATE CAPACITANCE AND STRUCTURE FOR SAME

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/966,510

(22) Filed: Dec. 11, 2015

(51) Int. Cl.
| H01L 21/00 | (2006.01) |
| H01L 29/66 | (2006.01) |
| H01L 29/06 | (2006.01) |
| H01L 29/78 | (2006.01) |

(52) U.S. Cl.
CPC ........ *H01L 29/6656* (2013.01); *H01L 29/0649* (2013.01); *H01L 29/0676* (2013.01); *H01L 29/66545* (2013.01); *H01L 29/66795* (2013.01); *H01L 29/785* (2013.01); H01L 2029/7858 (2013.01)

(58) Field of Classification Search
CPC ................ H01L 29/6656; H01L 29/66795; H01L 29/0676
See application file for complete search history.

(56) References Cited

U.S. PATENT DOCUMENTS

| 6,686,630 | B2* | 2/2004 | Hanafi | H01L 29/78648 257/347 |
| 8,859,355 | B1* | 10/2014 | Leobandung | H01L 29/785 257/E21.703 |
| 8,900,951 | B1* | 12/2014 | Cheng | H01L 29/0673 257/E21.453 |
| 8,969,149 | B2* | 3/2015 | Leobandung | H01L 29/78609 257/18 |
| 8,994,081 | B2* | 3/2015 | Leobandung | H01L 29/78609 257/18 |
| 9,202,919 | B1* | 12/2015 | Liu | H01L 29/785 |
| 2002/0153587 | A1* | 10/2002 | Adkisson | H01L 21/76264 257/510 |
| 2009/0121209 | A1* | 5/2009 | Balkenende | B82Y 10/00 257/4 |
| 2011/0147811 | A1* | 6/2011 | Kavalieros | H01L 29/66795 257/288 |
| 2012/0070947 | A1* | 3/2012 | Basker | H01L 29/66795 438/197 |

(Continued)

*Primary Examiner* — Laura Menz
(74) *Attorney, Agent, or Firm* — Cantor Colburn LLP; Louis Percello

(57) ABSTRACT

Disclosed are methods of forming a semiconductor structure comprising forming, on a supporting substrate, a plurality of composite structures, each comprising an elongated channel structure stacked over an elongated sacrificial base structure, the width of the elongated channel structure being greater than the width of the elongated base structure, subsequently forming a dielectric isolation layer, depositing sacrificial gates, growing source and drain regions on opposed sides of the sacrificial gates, removing the sacrificial gates and recessing the dielectric isolation layer, and removing portions of each of the elongated sacrificial base structures, and forming functional gate structures in regions previously occupied by the sacrificial gates. Also disclosed are semiconductor structures and intermediate structures obtained during such fabrication methods.

20 Claims, 11 Drawing Sheets

(56) References Cited

U.S. PATENT DOCUMENTS

| | | | |
|---|---|---|---|
| 2013/0313649 A1* | 11/2013 | Basker | H01L 21/845 257/368 |
| 2013/0316513 A1* | 11/2013 | Basker | H01L 21/845 438/400 |
| 2014/0327045 A1* | 11/2014 | Leobandung | H01L 29/66795 257/192 |
| 2014/0339507 A1* | 11/2014 | Leobandung | H01L 29/78609 257/29 |
| 2014/0339611 A1* | 11/2014 | Leobandung | H01L 29/78609 257/288 |
| 2015/0061018 A1* | 3/2015 | Leobandung | H01L 27/1211 257/347 |
| 2015/0064854 A1* | 3/2015 | Leobandung | H01L 27/1211 438/157 |
| 2015/0255605 A1* | 9/2015 | Loubet | H01L 29/7848 257/192 |
| 2015/0270284 A1* | 9/2015 | Chou | H01L 27/1203 257/347 |
| 2015/0287776 A1* | 10/2015 | Leobandung | H01L 29/0607 257/347 |
| 2015/0333167 A1* | 11/2015 | Leobandung | H01L 29/78 257/347 |
| 2016/0027929 A1* | 1/2016 | Cheng | H01L 29/78696 257/9 |
| 2016/0043075 A1* | 2/2016 | Lavoie | H01L 27/088 257/365 |
| 2016/0086796 A1* | 3/2016 | Chan | H01L 21/02236 257/347 |
| 2016/0093740 A1* | 3/2016 | Harley | H01L 29/7851 257/347 |

* cited by examiner

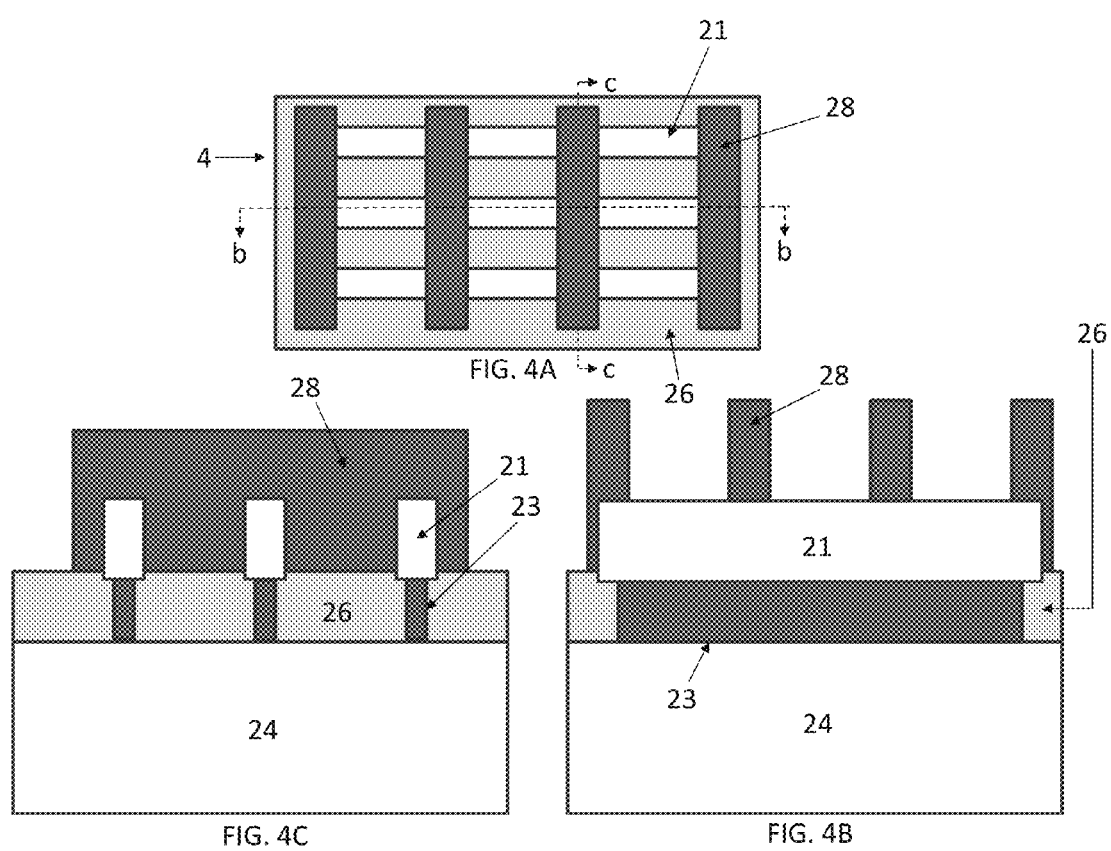

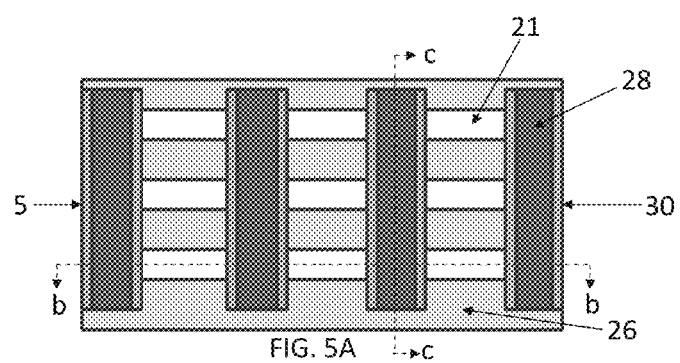
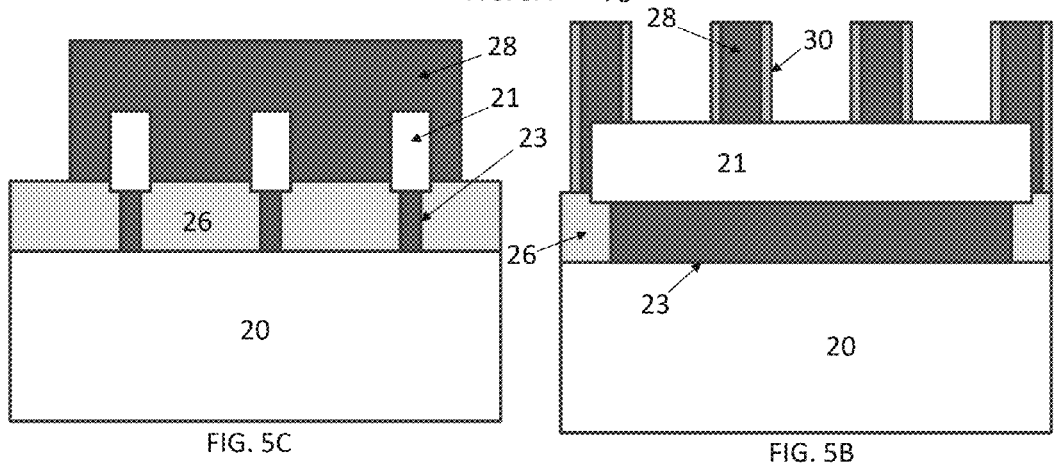
FIG. 5A
FIG. 5C
FIG. 5B

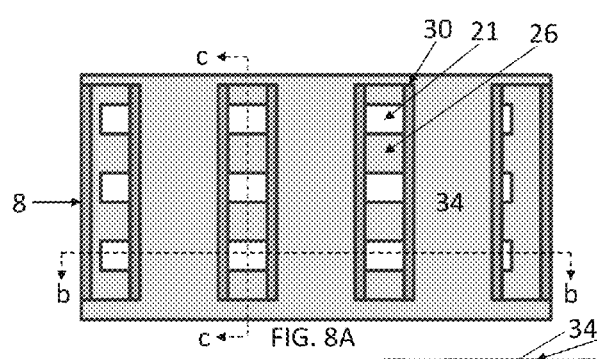
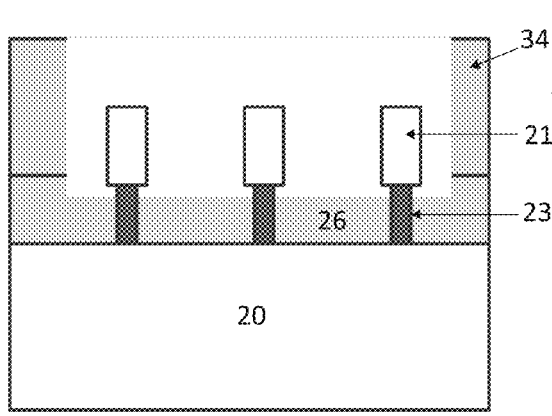
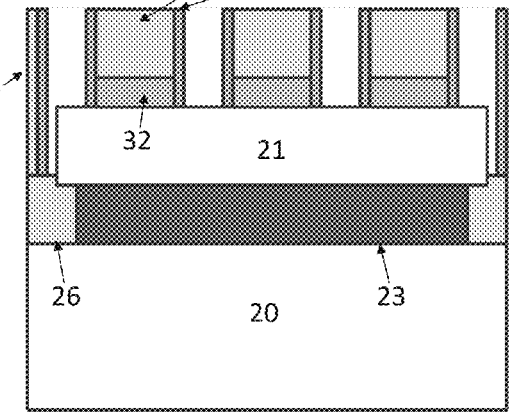
FIG. 8A
FIG. 8C
FIG. 8B

METHOD TO REDUCE PARASITIC GATE CAPACITANCE AND STRUCTURE FOR SAME

BACKGROUND

Field effect transistors generally comprise a source, a drain, a gate, and a channel between the source and drain. The gate is separated from the channel by a thin insulating layer, typically of silicon oxide, called the gate dielectric. The channel is covered by the thin gate dielectric and bordered on two or more sides by an overlying gate structure. A voltage drop generated by the gate across the gate dielectric layer induces a conducting channel between the source and drain, thereby controlling the current flow between the source and the drain. Current integrated circuit designs use complementary metal-oxide-semiconductor (CMOS) technology that use complementary and symmetrical pairs of p-type and n-type metal oxide semiconductor field effect transistors (MOSFETs) for logic functions.

The integrated circuit industry is continually reducing the size of the devices and increasing the number of circuits that can be produced on a given substrate or chip. Process challenges exist as the dimensions of semiconductor devices decrease, some now falling below 20 nm. As the dimensions of the device decrease, the spacing between the various circuit elements also decreases, leading to increased parasitic capacitance. Parasitic capacitance is the unwanted capacitance that exists between the parts of an electronic component or circuit simply because of their proximity to each other. The increased parasitic capacitance can have detrimental effects on the circuit performance, limiting the frequency response of the device.

The channel in FETs can consist of a fin or nanowire structure. The "fin" is typically a vertically narrow and elongated structure, for example, comprising III-V semiconductor. A nanowire is a structure that can have a diameter on the order of a nanometer.

For present purposes, the term "semiconductor channel" or "channel" are used to generically include both "fin" and "nanowire" that can be used in FinFETs or nanowire FETs.

It would be desirable to decrease or eliminate parasitic capacitance issues transistors employing fin structures or nanowires.

SUMMARY

One aspect is directed to methods of fabricating a semiconductor structure comprising A method of forming a semiconductor structure, comprising patterning a semiconductor layer and sacrificial release layer over a substrate, wherein the semiconductor layer is above and in direct contact with the sacrificial release layer, to form a plurality of composite structures, each comprising an elongated channel structure stacked over an elongated sacrificial base structure, the width of the elongated channel structure being greater than the width of the elongated base structure; forming a dielectric isolation layer directly on the substrate to a vertical height level that is over the upper most surfaces of the elongated sacrificial base structures but below the upper most surfaces of the elongated channel structures; depositing sacrificial gates over the middle portion of each of the elongated channel structures in a direction essentially perpendicular to the elongated channel structures; growing source and drain regions on opposed sides of the sacrificial gates; removing the sacrificial gates and recessing the dielectric isolation layer to a vertical height level below the lowest surface of the elongated channel structures; and removing portions of each of the elongated sacrificial base structures so that empty spaces are formed under each elongated channel structure, wherein narrow vertical empty spaces are formed in the dielectric isolation layer under each elongated channel structure below regions previously occupied by the sacrificial gates.

Another aspect is directed to a method comprising forming a semiconductor structure, comprising forming a semiconductor layer over a sacrificial release layer that is over a silicon substrate; patterning the semiconductor layer and sacrificial release layers to form a plurality of essentially parallel bottlenecked structures, each comprising an elongated channel structure stacked over an elongated sacrificial base structure, the width of the elongated channel structure being greater than the width of the elongated base structure; forming a dielectric isolation layer directly on the silicon substrate to a vertical height level that is over the upper most surface of the elongated sacrificial base structures but below the upper most surfaces of the elongated channel structures; depositing a sacrificial gate over the middle portion of each of the elongated channel structures in a direction essentially perpendicular to the elongated channel structures; growing source and drain regions on opposed sides of the sacrificial gates; removing the sacrificial gates and recessing the a dielectric isolation layer, in a region previously occupied by the sacrificial gates, to a vertical height level below the lowest surface of the elongated channel structures; removing portions of each of the elongated sacrificial base structure so that empty spaces are formed under the elongated channel structures in regions previously occupied by the sacrificial gates and narrow vertical empty spaces are formed in the dielectric isolation layer in spaces previously occupied by portions of the elongated sacrificial base structures, wherein a series of separated base elements, which remain of the elongated sacrificial base structure after removing portions thereof, are directly under the source and drain regions. The method further comprises depositing, in a region previously occupied by each sacrificial gate, a layer of gate dielectric material to cover the elongated channel structures and the dielectric isolation layer while also filling the narrow vertical empty spaces previously occupied by portions of the elongated sacrificial base structures; and forming a conductive gate in a region previously occupied by the sacrificial gate.

Another aspect of the invention relates to a semiconductor structure obtained by embodiments of the above-described methods, which structure comprises a plurality of elongated channel structures; a plurality of functional gate structures comprising a gate conductor and gate dielectric layer, over the middle portion of each of the elongated channel structures in a direction essentially perpendicular to the elongated channel structures; a plurality of base elements formed from each of a plurality of elongated base layer structures, wherein portions of the elongated have been removed in the direction of the elongated structure; source regions and drain regions, on opposing sides of the gate structure under a planarized dielectric layer, comprised of III-V semiconductor material; wherein the source and drain regions are separated from the side walls of the gate structure, perpendicular to the direction of the elongated channel structures, by spacer walls; wherein at least a surface portion of each of the channel structures are in direct contact with a functional gate structure, and wherein the source and drain regions are in direct physical and electrical contact with portions of the channel structure; wherein a dielectric layer is stacked over the source regions and drain regions between the spacer walls, wherein narrow vertical spaces are formed in the dielectric isolation layer under each of the elongated channel structures, which narrow vertical spaces are filled with dielectric gate material, and which narrow vertical spaces are located and contiguous with a plurality of base elements, present in directly stacked relationship with the elongated channel structures, that are situated directly under the source and drain regions.

Yet another aspect of the invention relates to a semiconductor intermediate structure used in fabricating a field effect transistor comprising: a plurality of pairs of gate spacer walls each pair capable of defining a gate region that can be occupied by the functional gate structure of the field effect transistor, which gate spacer walls overlap a middle portion of each of the plurality of elongated channel structures in a direction essentially perpendicular to the elongated channel structures; a plurality of essentially parallel bottlenecked structures, each comprising an elongated channel structure stacked over an elongated sacrificial base structure, the width of the elongated channel structure being greater than the width of the elongated base structure, wherein the lower surfaces of the bottle necked structures are vertically in direct contact with an underlying substrate; a dielectric isolation layer directly on the underlying substrate that, in the gate region, has a vertical height level that is above the horizontal plane containing the lower most surfaces of the elongated sacrificial base structures but that is below the horizontal plane containing the lowest most surfaces of the elongated channel structures; source regions and drain regions on opposing sides of the gate spacer walls, under a planarized dielectric layer, which source and drain regions comprise III-V semiconductor material; wherein the source and drain regions are separated, by outside surfaces of pairs of gate spacer walls but are in direct contact with the elongated semiconductor channel structures.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals can denote like elements and parts, in which:

FIG. 4A shows a top plan view depicting one embodiment of forming a plurality of sacrificial gates over middle portions of each of the channel structures in the semiconductor structure of FIG. 2A, in accordance with the present disclosure.

FIG. 4B shows a cross-sectional view of the structure of FIG. 3A though one of the elongated channel structures, in the direction of elongation, along line b-b.

FIG. 4C shows a second cross-sectional view of the structure of FIG. 4A, along the line c-c of FIG. 4A, perpendicular to the cross-sectional view of FIG. 3B depicting one embodiment of forming sacrificial gate structures over middle portions of the channel structures.

FIG. 5A shows a top plan view depicting one embodiment of forming a first spacer wall along the sides of the sacrificial gate structures in the semiconductor structure of FIG. 4A, in accordance with the present disclosure.

FIG. 5B shows a cross-sectional view of the semiconductor structure of FIG. 5A in the direction of, and through, one of the elongated channel structures along line b-b.

FIG. 5C shows a second cross-sectional view of the structure of FIG. 5A along the line c-c, perpendicular to line b-b, depicting one embodiment of forming wall spacers on the sides of each sacrificial gate structure.

FIG. 8A shows a top plan view depicting one embodiment after the sacrificial gates in the structure of FIG. 7A have been removed and the dielectric isolation layer recessed slightly, to a vertical level below the channel structures, in a space previously occupied by the sacrificial gates, in accordance with the present disclosure.

FIG. 8B shows a first cross-sectional view of the structure of FIG. 8A, in the direction of elongation, and through, one of the channel structures along line b-b.

FIG. 8C shows a second cross-sectional view of the structure of FIG. 8A, perpendicular to the cross-sectional view of FIG. 8B, along the line c-c.

DETAILED DESCRIPTION

Figure 1A:
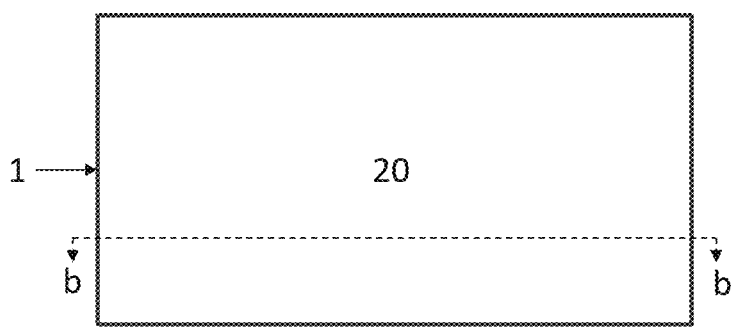
FIG. 1A shows a top plan view of a semiconductor substrate structure having a semiconductor layer that is present on a release layer that is supported by a semiconductor substrate such as bulk silicon, as used in accordance with one embodiment of the present disclosure.
Figure 1B:
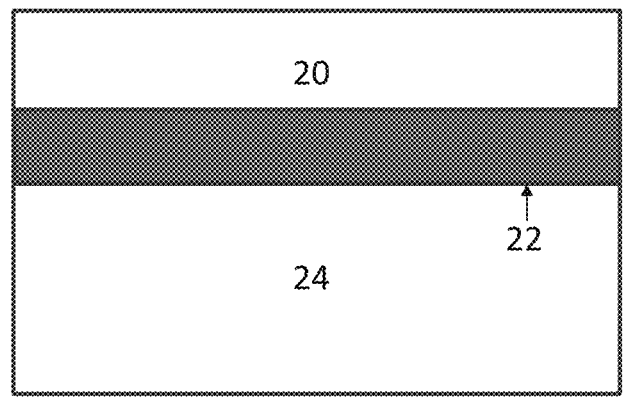
FIG. 1B shows a cross-sectional view through line b-b of the semiconductor substrate structure of FIG. 1A.

As stated above, the present disclosure relates to field effect transistors, including FinFETs and nanowire transistors, designed for reducing parasitic capacitance.

Detailed embodiments of the methods and structures of the present disclosure are described herein. However, it is to be understood that the disclosed embodiments are merely illustrative of the disclosed methods and structures that may be embodied in various forms. In addition, each of the examples given in connection with the various embodiments of the disclosure is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures. The same numbers in the various figures refer to the same structural component or part thereof.

FIGS. 1A to 11A depict one embodiment of methods of progressively fabricating FET structures 1 to 11, e.g., a p-type FET having channel structures 42 as shown in FIG. 14A. It will be readily appreciated by one or ordinary skill that the embodiment of FIGS. 1A to 11A can be used for fabricating semiconductor structures comprising either nanowires or fin structures or both.

Beginning with FIG. 1A, semiconductor structure 1 comprises a semiconductor layer 20 that is present on a release layer 22, over a supporting substrate 24, e.g., bulk silicon. In some embodiments, the semiconductor layer 20 is a silicon-containing layer.

The substrate 24 can be a single crystalline silicon substrate that is thick enough to provide mechanical support to the layers 22 and 20. The substrate 24 can be a blank (unpatterned) substrate having the same thickness throughout its entirety. The thickness of the substrate 24 can be in a range from 50 micron to 2 mm.

The material layers, release layer 22 and semiconductor layer 20, can be formed by deposition on the top surface of substrate 24 and patterning the material layers. The material layers, for example, can comprise from lower to upper, a silicon-germanium alloy layer and a silicon-containing semiconductor layer 20. The release layer 22 can be present on, e.g., in direct contact with, substrate 24 or bulk. The term "direct contact" means that a first element (such as a first structure) and a second element (such as a second structure) are connected without any intermediary conducting, insulating, or semiconductor layers at the interface of the two elements. The release layer 22 can be a single layer having a thickness ranging from 2 nm to 100 nm, specifically 5 to 60 nm, more specifically 10 to 50 nm, most specifically 20 to 40 nm, although lesser and greater thicknesses can also be employed.

The release layer 22 can include a single crystalline silicon-germanium alloy epitaxially aligned to the single crystalline structure of substrate 24. The atomic concentration of germanium can be in a range from 3% to 99%, although lesser and greater atomic concentrations can also be employed. The thickness and the atomic concentration of the silicon-germanium alloy can be selected such that the entirety of the release layer remains single crystalline without strain relaxation through generation of dislocation defects. The release layer 22 can be formed by an epitaxial deposition process employing a silicon precursor and a germanium precursor.

The silicon-containing semiconductor layer 20 can include single crystalline silicon-containing semiconductor material that is epitaxially aligned to the single crystalline structure of the alloy material in the release layer 24. In some embodiments, the silicon-containing semiconductor layer can comprise or consist essentially of silicon atoms or, alternatively, silicon atoms and electrical dopant atoms that can be p-type dopant atoms or n-type dopant atoms, thereby forming either n-channels or p-channels as desired. In another embodiment, the silicon-containing layer can consist essentially of silicon atoms at an atomic concentration not less than 97%, and carbon atoms at an atomic concentration not greater than 3%, and optional electrical dopant atoms at an atomic concentration not greater than 1%. In yet another embodiment, the silicon-containing semiconductor layer can consist essentially of silicon atoms at an atomic concentration not less than 97%, and germanium atoms at an atomic concentration not greater than 3%, and optional electrical dopant atoms at an atomic concentration not greater than 1%. In some embodiments, the thickness of the silicon-containing layer can be in a range from 5 nm to 200 nm, specifically 10 to 100 nm, more specifically 25 to 50 nm, although lesser and greater thicknesses can also be employed. The silicon-containing semiconductor layer 20 can be formed by a second epitaxial deposition process employing a silicon precursor and optionally additional precursors for incorporating atoms other than silicon atoms.

Figure 2A:
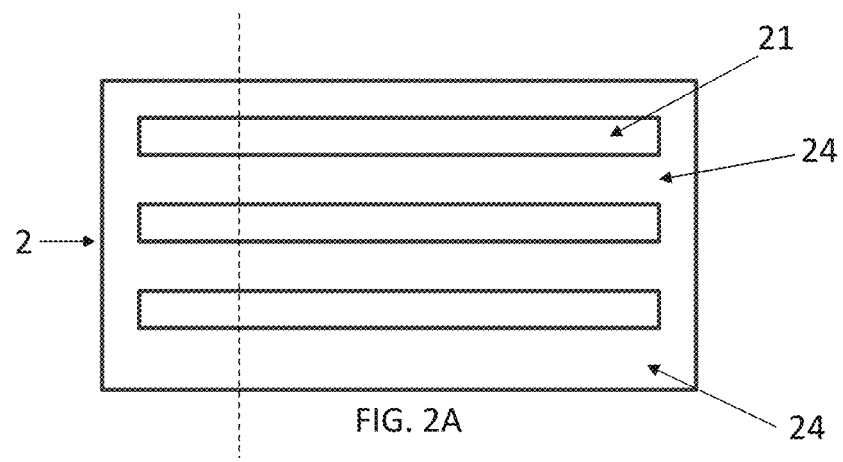
FIG. 2A shows a top plan view depicting one embodiment of patterning, the upper two layers on the semiconductor substrate structure of FIG. 1A to provide a plurality of substantially parallel and elongated composite structures ("bottlenecked" in cross-section) each comprising a relatively wider elongated channel structure stacked on (the "bottleneck") a relatively narrower elongated sacrificial base structure, in accordance with one embodiment of the present disclosure.

A photoresist layer (not shown) can be applied over the semiconductor layer 20 of FIG. 1A and lithographically patterned to cover rectangular regions to obtain the semiconductor structure 2 of FIG. 2A. An anisotropic etch can be performed to etch through physically exposed portions of the semiconductor layer 20, the release layer 22, and, optionally, an upper portion of the substrate 24.

In one embodiment, etching the layers can include forming a patterned photoresist layer, i.e., photomask, on the semiconductor layer 20, and etching the two stacked layers selectively to the photomask and the release layer 22. In one embodiment, a pattern is produced by applying a photoresist to the surface to be etched, exposing the photoresist to a pattern of radiation, and then developing the pattern into the photoresist utilizing a resist developer. Once the patterning of the photoresist is completed, the sections of the two stacked layers covered by the photoresist are protected to provide the elongated channel structures 21 each with sacrificial base structure 23, while the exposed regions can be removed down to bulk silicon of substrate 24, using the selective etching process.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater.

An anisotropic etch process is a material removal process in which the etch rate in the direction normal to the surface to be etched is greater than in the direction parallel to the surface to be etched. Such an anisotropic etch can include reactive-ion etching (RIE) or crystallographic wet etch. Other examples of anisotropic etching that can be used include ion beam etching, plasma etching, or laser ablation. Subsequent to patterning both the semiconductor layer 20 and release layer 22, the patterned release layer can be converted to a bottle neck by isotropically etching the patterned release layer 22 alone, not including the channel structure 21. Specifically, the sacrificial base channels 23 can be isotropically etched, for example, employing Hydrochloric acid (HCl) vapor at a temperature of about 400° C.

Thus, in structure 2 of FIG. 2A, each remaining portion of the release layer 22 constitutes an elongated sacrificial base structure. Each remaining portion of the semiconductor layer 20 constitutes an elongated channel structure 21, designed as a fin or nanowire. The composite structure in which the elongated channel structure is stacked over the elongated sacrificial base structure 21 forms, in cross-section perpendicular to the direction of elongation, an elongated "bottle necked" structure 25 as clearly shown in FIG. 2B. The lowest horizontal surface is now that of the exposed substrate 24, for example, bulk silicon.

By "bottle necked" is meant that, in the direction of elongation, the width W2 of the lower sacrificial base structure is less than the width W1 of the upper channel structure. In other words the bottle necked composite structure 25 constitutes an elongated vertical stack with the stack layers of unequal width in the direction of elongation. Specifically the upper channel structure is wider than the lower sacrificial base layer so that the sidewalls of the channel structure are not vertically coincident with the side walls of the lower sacrificial base structure 23. As used herein, two surfaces are not vertically coincident with each other if there does not exist a vertical plane that includes the two surfaces.

In reference to the "sacrificial base structure" and the like, the term "sacrificial" denotes a structure that will not be present, or not entirely present, in a later stage of the process, but which can fill a space for a functional replacement.

The width W1 of the channel structures 21 can also be less than the width W3 of later source and drain regions (e.g., source and drain regions 32 of FIGS. 6A to 11A). In some embodiments, the width W1 of channel structures 21 can range from 1 nm to 12 nm, and the width W2 of the sacrificial base structures 23 can range from 0.5 nm to 10 nm, specifically 1 to 5 nm.

As mentioned previously, the channel structures can be structurally in the form of fins or nanowires.

Adjacent elongated channel structures 21 may be separated by a pitch P1 ranging from 20 nm to 100 nm. In one embodiment, adjacent elongated fin structures 30 can be separated by a pitch P1 ranging from 15 nm to 60 nm, specifically 25 to 50 nm.

Figure 2B:
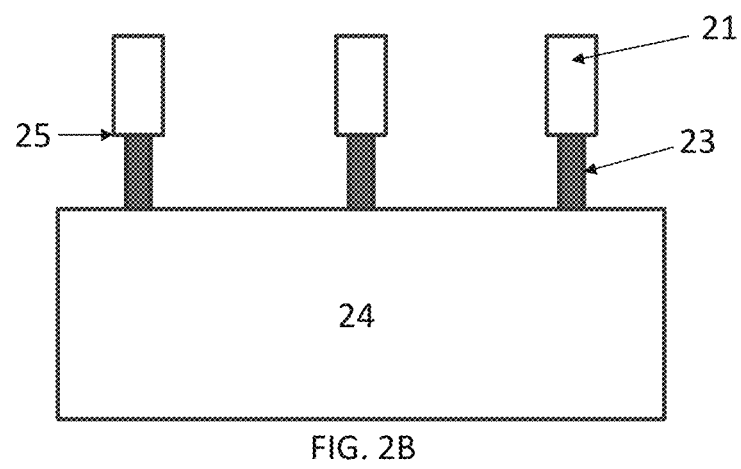
FIG. 2B shows side cross-sectional view through line b-b of the structure of FIG. 2A, showing the "bottlenecked" composite structure.
Figure 3A:
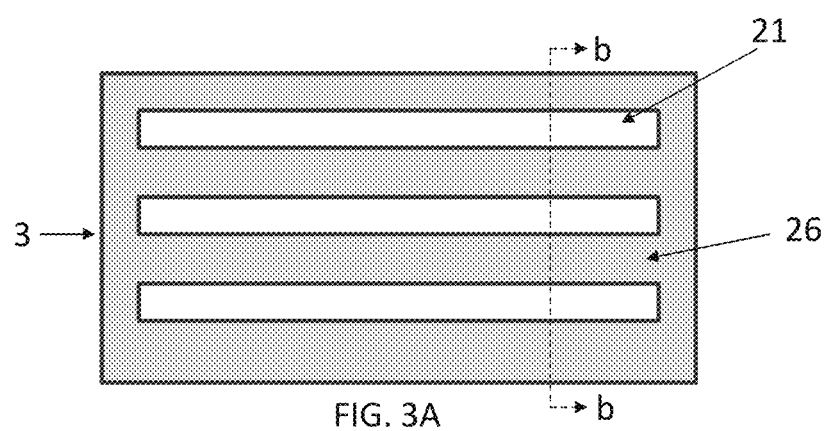
FIG. 3A shows a top plan view depicting one embodiment after depositing a dielectric isolation layer on the semiconductor structure of FIG. 2A and planarizing the dielectric layer to a vertical level above the sacrificial base structure but below the top of the channel structure, in accordance with the present disclosure.
Figure 3B:
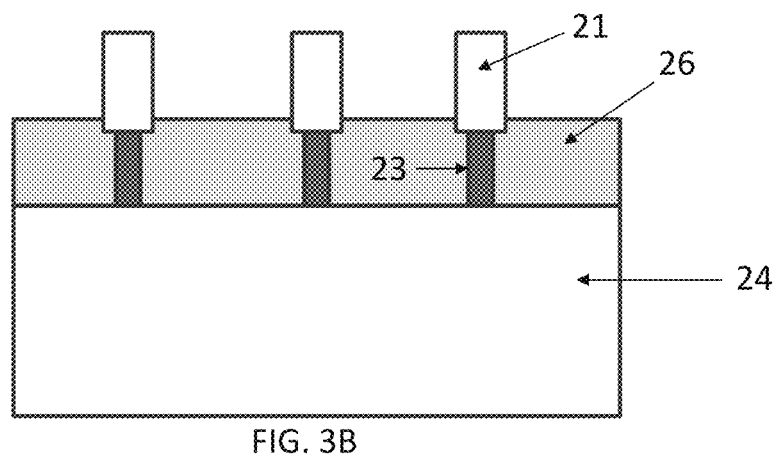
FIG. 3B shows a cross-sectional view of the structure of FIG. 3A along line b-b.

The semiconductor structure 2 of FIG. 2A can then blanketed with a dielectric isolation layer 26 as shown in FIGS. 3A and 3B to form semiconductor structure 3. In particular, FIG. 3A shows a top plan view. FIG. 2B shows a cross-sectional view perpendicular to the channel structures 21 along lines b-b, in which view the depth of the planarized dielectric 26 is evident. The dielectric isolation layer 26 can be can be deposited or formed by a method that is selected from the group consisting of chemical vapor deposition (CVD), chemical solution deposition, thermal growth, spin on deposition or a combination thereof. The dielectric layer can be formed by depositing a layer of silicon dioxide and then planarizing the layer employing a conventional technique such as CMP polishing (Chemical-Mechanical Polishing).

Referring to FIGS. 3A and 3B, the dielectric isolation layer 26 is formed around the elongated bottlenecked composite structures 25 and over the substrate 24. The dielectric isolation layer 26 can include a dielectric material such as silicon oxide, silicon nitride, or a dielectric metal oxide. In one embodiment, the dielectric isolation layer 26 includes silicon oxide. The dielectric isolation layer 26 can be formed, for example, by deposition of a dielectric material layer at least above the height of the top surfaces of the sacrificial base structures 23 but below the top surfaces of the semiconductor channel structures 21. The deposited material for the dielectric isolation layer can be subjected to planarization employing the top surfaces of the semiconductor channel structures 21 as stopping layers, and then recessing of the dielectric material to a height between the top surfaces and the bottom surfaces of the semiconductor channel structures 21. Alternately, the dielectric isolation layer 26 can be formed by deposition of a self-planarizing dielectric material such as spin-on-glass (SOG).

A horizontal plane including a top surface of one or all of the semiconductor channel structures 21 may be referred to as a first horizontal plane. Likewise, the horizontal plane including the bottom surfaces of the semiconductor channel structures 21 can be referred to as a second horizontal plane. Accordingly, the top surface of the dielectric isolation layer 26 can be formed between the first horizontal plane and the second horizontal plane.

In particular, the plurality of substantially parallel and elongated bottlenecked composite structures 25 comprising a relatively wider channel structure 21 and a relatively narrower (bottlenecked) sacrificial base structure 23, in cross-section perpendicular to the direction of elongation, can be blanketed with a dielectric material, wherein the deposited material can be planarized in the z-direction (direction of thickness perpendicular to the x-y plane of the dielectric isolation layer) to a vertical height above the top surface of the sacrificial base structure 23 but below the top surface of the channel structures 21, in accordance with the present disclosure, as shown clearly in FIG. 3B.

FIG. 4A depicts one embodiment of forming sacrificial (i.e., disposable) gate structures over a portion of the elongated fin structures 21 of previous semiconductor structure 3. The sacrificial gates can later be removed after serving its intermediate function during fabrication of a semiconductor device as herein disclosed.

Referring to FIGS. 4A, B and C, each sacrificial gate structure 28 is formed across at least one elongated channel structure, specifically a plurality thereof (of which three are shown in FIG. 4A).

The sacrificial gate structures 28 can be formed, for example, by deposition of a disposable material layer and patterning of the disposable material layer.

In some embodiments, the disposable material for the sacrificial gate structures 28 can be made of an oxide, amorphous silicon, or hard mask nitride material such as silicon nitride. The disposable material for the sacrificial gate structures can include a semiconductor material, a dielectric material, or a metallic material, provided that the disposable material can be removed selective to the dielectric isolation layers and, to be subsequently formed, gate wall spacers, and selective to the material of the semiconductor (e.g., silicon-containing) channel structures 21. For example, the disposable material can include amorphous carbon, amorphous silicon, an oxide or nitride, polycrystalline or amorphous germanium, a silicon-germanium alloy having an atomic concentration of germanium greater than 40%, organosilicate glass, a doped silicate glass, an elemental metal, an alloy of at least two elemental metals, a conductive metallic alloy, or a combination thereof.

In the embodiment of FIG. 4, the sacrificial gate structures 28 straddle the elongated channel structures 21 along the widthwise direction, and surfaces of the gate structures 28 can contact the top surface of a dielectric isolation layer 26, but not the sidewalls of the sacrificial base structure 23 on which "sits" each of the channel structures 21.

The sacrificial gate structures 28 can be formed using deposition, photolithography and etch processes. For example, the material layer for the sacrificial gate structures can be blanketed over the structure 3 of FIG. 3A and then the material layer patterned and etched, specifically by an anisotropic etch, to provide the sacrificial gate structures 28.

Specifically, and in one example, a pattern can be produced by applying a photoresist to the surface to be etched, exposing the photoresist to a pattern of radiation such as RIE etching crystallographic wet etch, and then developing the pattern into the photoresist utilizing a resist developer. Once the patterning of the photoresist is completed, the sections of the material for the sacrificial gate structures 28 covered by the photoresist are protected to provide the sacrificial gate structures 28, while the exposed regions are removed using a selective etching process that removes the unprotected regions. Following formation of the sacrificial gate structures 28, the photoresist can be removed. FIGS. 4B and 4C show the patterned sacrificial gates in cross-sections, one of the views perpendicular to the other, as indicated in the FIGS.

FIGS. 5A, B, and C show a top plan view and two cross-sectional views of a semiconductor structure 5, one view in a direction through an elongated channel structure along line b-b and the other view perpendicular to that cross-sectional view through a sacrificial gate structure 28. Gate spacer walls 30 have been formed on the side surfaces of the sacrificial gates 28 in their direction of elongation. The gate spacer walls 30 can, for example, comprise a nitride such as silicon nitride deposited selectively on the walls of the sacrificial gate structures 28 at a thickness of 1 to 20 nm, specifically 5 to 15 nm, more specifically 8 to 12 nm. The gate spacer walls 30 can allow some space between the source/drain to be formed and the sacrificial gate in order to isolate the sacrificial gate during subsequent processing steps. The gate spacer walls can also play a role in the method of fabrication, as disclosed hereafter.

The gate spacer walls 30 can be conformably deposited as a surface layer on the semiconductor structure 4 of FIG. 4A, for example, by CVD or like depositional processes, followed by an anisotropic etch that removes horizontal portions of the layer. Variations of CVD can include, but are not limited to, APCVD, LPCVD, PECVD, MOCVD, ALD, and combinations thereof.

Figure 6A:
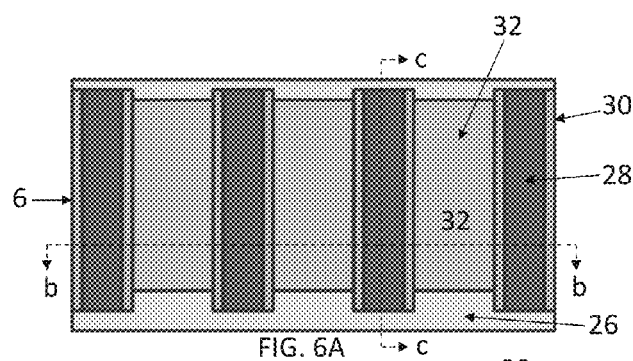
FIG. 6A shows a top plan view depicting one embodiment in which III-V semiconductor source and drain structures have been grown in an area between the sacrificial gates in the semiconductor structure of FIG. 5A, separated by the wall spacers, in accordance with the present disclosure.

FIG. 6A depicts one embodiment of forming III-V source/drain structures 32 in regions between the elongated sacrificial gate structures 28 (outside gate side walls in the present embodiment) and over the planarized first dielectric isolation layer 26. The term "III-V semiconductor" denotes a semiconductor material that includes at least one element from Group III of the Periodic Table of Elements and at least one element from Group V of the Periodic Table of Elements. Typically, III-V compound semiconductors are binary, ternary or quaternary alloys including III/V elements. Examples of III-V semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

In the embodiment of FIG. 6A, III-V semiconductor material 32 is formed over a portion of the channel structures 21 outside the sacrificial gates using an epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the fin structure (a semiconductor material such as silicon or silicon germanium) with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Examples of various epitaxial growth process apparatuses that are suitable for use with the present disclosure include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE), and metalorganic chemical vapor deposition (MOCVD). The temperature for epitaxial deposition process for forming the III-V wall structures 36 typically range from 550° C. to 900° C. Although higher temperature typically results in faster deposition, the faster deposition can result in crystal defects and film cracking.

Figure 6C:
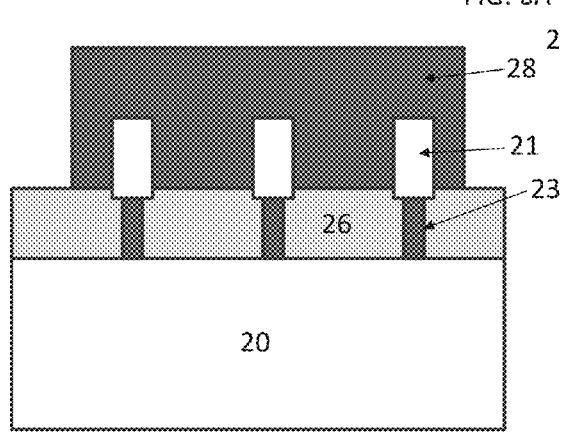
FIG. 6C shows a second cross-sectional view of the semiconductor structure of FIG. 6A, perpendicular to the cross-sectional view of FIG. 6B, along the line c-c, in accordance with the present disclosure.
Figure 6B:
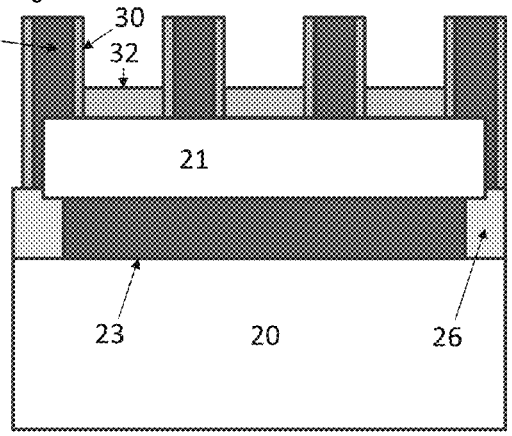
FIG. 6B shows a first cross-sectional view of the structure of FIG. 6A along the line b-b in the direction of, and through, one of the elongated channel structures.

Referring to FIGS. 6A-6C, in some embodiments, active source and drain regions 32 can be formed at this step by implantation of electrical dopants, which can be p-type dopants and/or n-type dopants, into physically exposed portions of the silicon-containing channel structures 21, for example, nanowires. An unimplanted portion of a silicon-containing nanowire channel structure can constitute a body region of a field effect transistor.

Raised active regions can be formed on physically exposed semiconductor surfaces of the channel structures 21 by selective deposition of a semiconductor material. As used herein, a "raised active region" can be a raised source region or a raised drain region. The raised active regions include a raised source region and a raised drain region, as will be understood by the skilled artisan.

In one embodiment, the raised active regions (source and drain) can be formed with in-situ doping during the selective epitaxy process. Thus, each portion of the raised active regions can be formed as doped semiconductor material portions. Alternatively, the raised active regions can be formed by ex-situ doping. In this case, the raised active regions can be formed as intrinsic semiconductor material portions and electrical dopants can be subsequently introduced into the raised active regions to convert the raised active regions into doped semiconductor material portions.

Figure 7A:
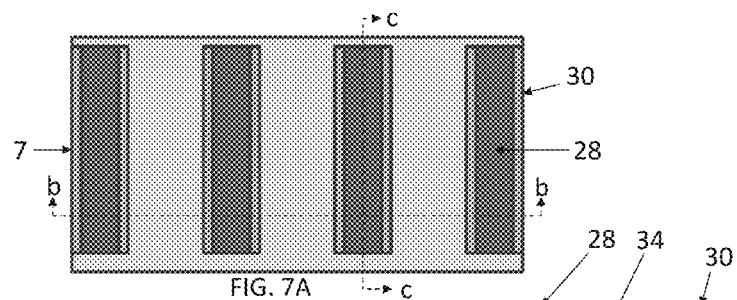
FIG. 7A shows a top plan view depicting one embodiment after subjecting the semiconductor structure of FIG. 6 A to planarization with a dielectric (ILD) to form an upper dielectric layer, in accordance with the present disclosure.
Figure 7C:
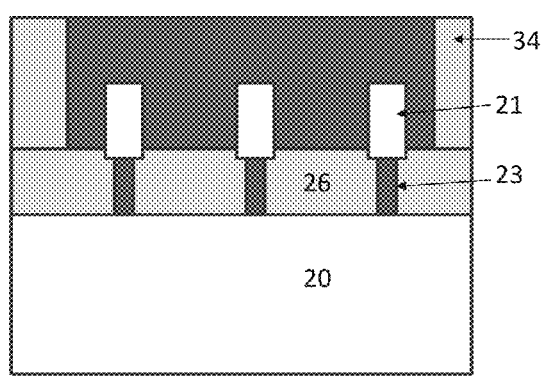
FIG. 7C shows a second cross-sectional view of the structure of FIG. 7A, perpendicular to the cross-sectional view of FIG. 7B, along the line c-c, in accordance with the present disclosure.
Figure 7B:
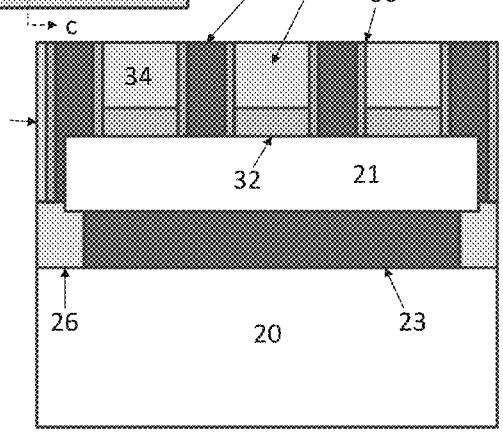
FIG. 7B shows a first cross-sectional view of the structure of FIG. 7A in the direction of, and through, one of the elongated channel structures along line b-b.

FIG. 7A shows a top plan view depicting one embodiment in which material for an upper dielectric layer 34 is applied to semiconductor structure 6 of FIG. 6A and then planarized to obtain an inter-layer-dielectric (ILD), therefore covering the source and drain regions with a planarized upper dielectric layer 34. FIGS. 7B and 7C show cross-sectional views of the structure of FIG. 7A, one view in the direction of, and through, one of the elongated channel structures along line b-b and a second view along line c-c.

The upper dielectric layer 34 can include a dielectric material such as undoped silicate glass, doped silicate glass, silicon oxynitride, organosilicate glass (OSG), a dielectric metal oxide, a dielectric metal oxynitride, or a combination thereof. The materials of the dielectric isolation layer 26 and the upper dielectric layer 34 can be the same or different.

The upper dielectric layer 34 can be deposited employing a self-planarizing deposition method such as spin-on coating. Alternately, the upper dielectric layer 34 can be deposited employing a conformal deposition method such as chemical vapor deposition method, and can be subsequently planarized and/or recessed to provide a planar top surface. In the case of a conformably deposited dielectric material that is planarized, the top surface of the sacrificial gate structures 28 can be employed as a stopping layer during a planarization process. The amount of the deposited material during a spin-on coating, or the depth of recess during the recessing of conformably deposited dielectric material, can be selected such that a planar top surface of the upper dielectric layer 34 is even or level with a third horizontal plane including the top surfaces of the sacrificial gates 28 and top surfaces of the gate spacer walls 30, which upper dielectric layer 34 can cover the active (source and drain) regions 32.

FIG. 8A shows a top plan view depicting one embodiment in which the sacrificial gates 28 in the semiconductor structure 7 of FIG. 7A have been removed and the dielectric isolation layer 26 recessed slightly to a vertical height level below the lower surface of the channel structures 21. FIG. 8B shows a first cross-sectional view of the semiconductor structure 8 of FIG. 8A, in the direction of elongation of, and through, one of the channel structures 21 along line b-b, and FIG. 8C shows a second cross-sectional view of the structure of FIG. 8A, perpendicular to the cross-sectional view of FIG. 8B, along the line c-c. In fabricating the embodiment of FIG. 8A, the sacrificial gate structures 28 can be removed by an RIE anisotropic dry etch or crystallographic wet etch.

The dielectric isolation layer 26 can be recessed slightly by using an isotropic wet etch selective to the material of the base sacrificial structures 23. In one embodiment, the recessing of the dielectric isolation layer 26 can be performed by an anisotropic etch.

Specifically, the topmost surface of the dielectric isolation layer 26 can be recessed to a vertical height or level a predesigned distance below the lower surface of the channel structures 21, exposing an upper vertical portion of the sacrificial base structures 23.

As evident, the intermediate semiconductor structure of FIG. 8A, 8B, and 8C comprises a plurality of pairs of gate spacer walls each pair capable of defining a gate region that can be occupied by the functional gate structure of the field effect transistor, which gate spacer walls overlap a middle portion of each of the plurality of elongated channel structures in a direction essentially perpendicular to the elongated channel structures; a plurality of essentially parallel bottle-necked structures, each comprising an elongated channel structure stacked over an elongated sacrificial base structure, the width of the elongated channel structure being greater than the width of the elongated base structure, wherein the lower surfaces of the bottle necked structures are vertically in direct contact with an underlying substrate; a dielectric isolation layer directly on the underlying substrate that, in the gate region, has a vertical height level that is above the horizontal plane containing the lower most surfaces of the elongated sacrificial base structures but that is below the horizontal plane containing the lowest most surfaces of the elongated channel structures; source regions and drain regions on opposing sides of the gate spacer walls, under a planarized dielectric layer, which source and drain regions comprise III-V semiconductor material. The source and drain regions are separated, by outside surfaces of pairs of gate spacer walls but are in direct contact with the elongated semiconductor channel structures.

Figure 9A:
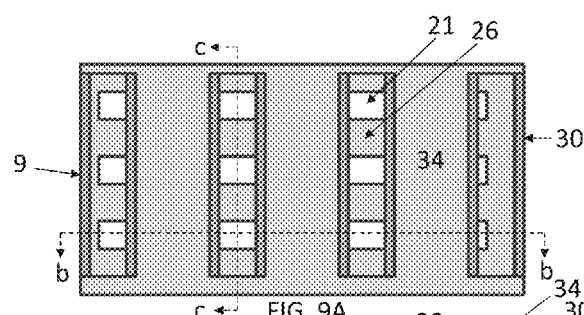
FIG. 9A shows a top plan view depicting one embodiment wherein separated portions of each of the sacrificial base structures have been removed, in a space previously occupied by sacrificial gates, between the spacer walls, in accordance with the present disclosure.

FIG. 9A depicts an embodiment involving removing portions of the elongated sacrificial base structures 23 in a space previously occupied by each sacrificial gate between a pair of gate spacer walls 30. Such portions of the sacrificial base structures 23 can be removed by an isotropic etch, for example wet etching with hydrochloric acid vapor at about 400° C. or the like.

Figure 9C:
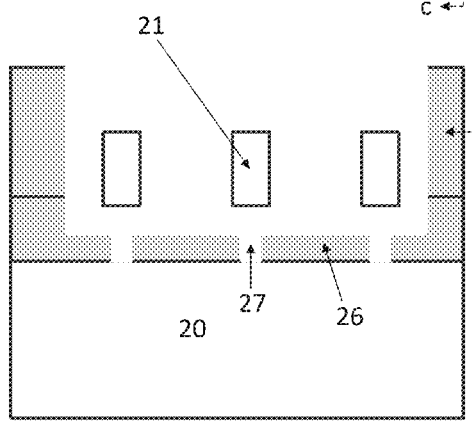
FIG. 9C shows a second cross-sectional view of the structure of FIG. 9A, perpendicular to the cross-sectional view of FIG. 9B, along the line c-c, in accordance with the present disclosure.
Figure 9B:
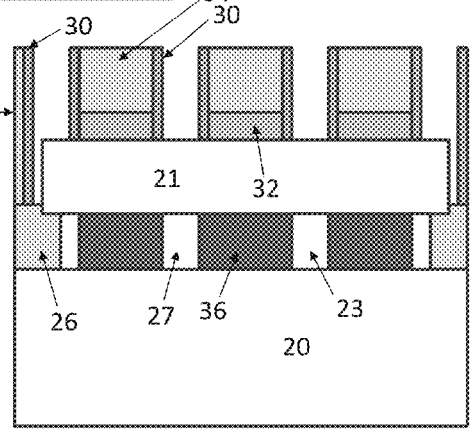
FIG. 9B shows a first cross-sectional view of the structure of FIG. 9A along the line b-b through, and in the direction elongation, of one of the channel structures.

FIG. 9B clearly shows a cross-section of the structure of FIG. 9A in which view the effect of the etching on the sacrificial base structures 23 is seen in cross-section. As evident especially in FIG. 9B, each of the sacrificial base structures 23 in the semiconductor structure 8 of FIG. 8B has now been divided into a plurality of base elements 36 under the source and drain regions 32. Specifically, each of the elongated sacrificial base structure 23 has been divided into a series, or row, of isolated based elements each having four vertical sides. Furthermore, in the embodiment of FIG. 9A it can be seen that, within a pair of gate spacer walls, in the space previously occupied by a sacrificial gate, the channel structures 21 now appear lifted above the surface of the first dielectric isolation layer, forming cavities or empty spaces 27.

To obtain the semiconductor structure 9 of FIG. 9, portions of the sacrificial base structures 23 can be etched to form base elements 36 by an isotropic etch, either a wet etch or dry etch. In one embodiment, the isotropic etch can comprise hydrochloric acid (HCl) vapor at a temperature of about 400° C.

Figure 10A:
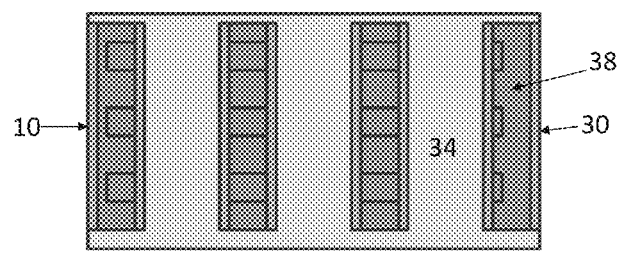
FIG. 10A shows a top plan view depicting one embodiment in which a sacrificial gate dielectric layer has been applied to a space previously occupied by the sacrificial gate, while also filling in the cavities resulting from removing portions of the sacrificial base structure existing in the previous semiconductor structure of FIG. 9A, in accordance with the present disclosure.

FIG. 10A shows a top plan view depicting one embodiment in which a real (functional) gate dielectric and real (functional) gate conductor) have been added to the semiconductor structure 9 of the previous FIG. 9A. A gate dielectric material, specifically a high-k material, is used to cover the surface area left by the sacrificial gate, between the gate spacer walls, while also filling in the portions of the sacrificial base structure that had been removed when forming the base elements 36.

The at least one gate dielectric layer 38 can be composed of any dielectric material including oxides, nitrides and oxynitrides. In one embodiment, the at least one gate dielectric layer can be provided by a high-k dielectric material. The term "high-k" as used to describe the material of the at least one first gate dielectric layer denotes a dielectric material having a dielectric constant greater than silicon oxide ($SiO_2$) at room temperature (20° C. to 25° C.) and atmospheric pressure (1 atmosphere). For example, a high-k dielectric material can have a dielectric constant greater than 4.0. In another example, the high-k gate dielectric material has a dielectric constant greater than 7.0.

In one embodiment, the gate dielectric layer is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric layer can include hafnium silicate, hafnium silicon oxynitride, or combinations thereof.

In one embodiment, the gate dielectric layer can be deposited by chemical vapor deposition (CVD). Variations of CVD processes suitable for depositing the gate dielectric layer are described above. In one embodiment, the thickness of the gate dielectric layer is greater than 0.8 nm to 10 nm, specifically about 1.0 nm to about 6.0 nm.

Figure 10C:
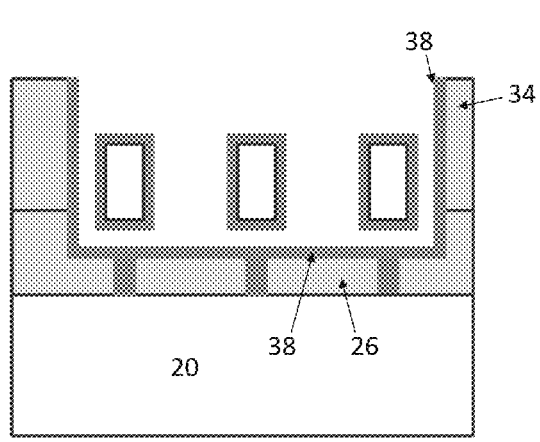
FIG. 10C shows a second cross-sectional view of the structure of FIG. 10A, perpendicular to the cross-sectional view of FIG. 10B, along the line c-c.
Figure 10B:
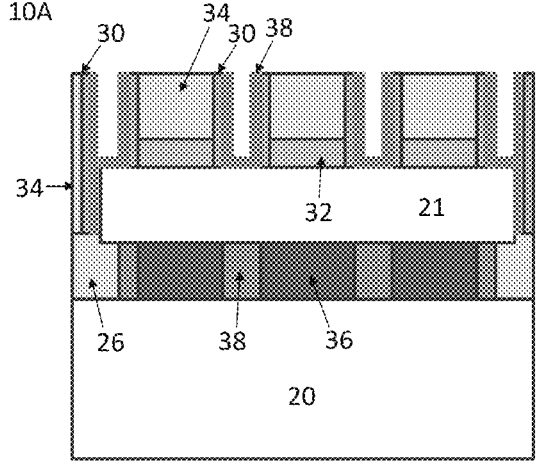
FIG. 10B shows a first cross-sectional view of the structure of FIG. 10 through a channel structure and in its direction of elongation, along line b-b.

FIG. 10B shows a first cross-sectional view of the structure of FIG. 10A through a channel structure 21 along line b-b.

FIG. 10C shows a second cross-sectional view of the structure of FIG. 10A, perpendicular to the cross-sectional view of FIG. 10B, along the line c-c.

Figure 11A:
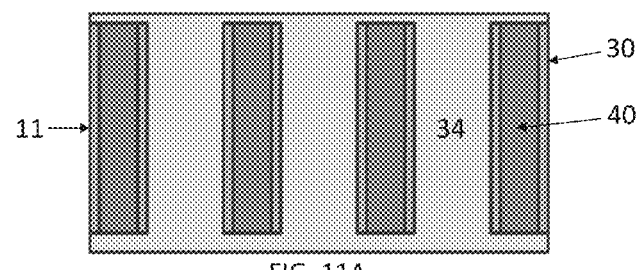
FIG. 11A shows a top plan view depicting one embodiment in which real (functional) gates and gate dielectric layers have been added to the semiconductor structure of previous FIG. 10A, in accordance with the present disclosure.

Referring now to FIGS. 11A, B, and C, a conductive or metal gate has been deposited to form the replacement (real or functional) gate structure, comprising both dielectric and conductive portions, in the gate cavity previously occupied by the sacrificial gate, It is noted that the gate dielectric 38, which is relatively thin, is omitted from the view of FIG. 11A for simplicity.

Figure 11C:
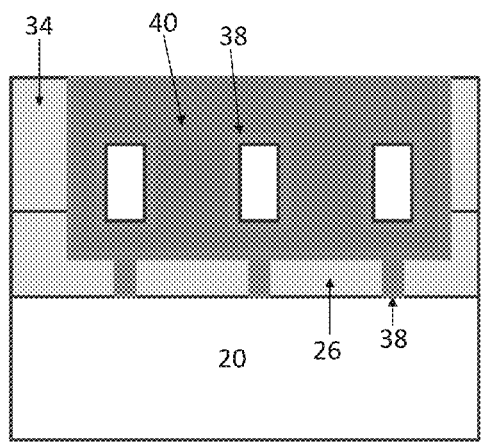
FIG. 11C shows a second cross-sectional view of the structure of FIG. 11A, perpendicular to the cross-sectional view of FIG. 11B, along the line c-c, depicting one embodiment in which real gate conductors and gate dielectrics are present in spaces previously occupied by the sacrificial gates.

The conductive material for the gate can include any conductive material that is known to be suitable for a gate electrode of a field effect transistor. A conductive material layer can be applied to the semiconductor structure 10 of FIG. 10, and then the excess portion of the gate dielectric layer can be removed beyond the level of dielectric isolation layer 34, for example, by chemical mechanical planarization (CMP). In the embodiment of FIG. 11C, the gate dielectric 38 and gate conductor 40 can be seen surrounding the channel structures 21 on all sides (four sides in this case as compared to channel structures having a circular cross-section).

Thus, field effect transistors disclosed herein can include wrap-around gates. Since the degree of control of electronic transport in the channel region of a field effect transistor is a predominant factor determining the level of leakage currents, a wraparound gate is a configuration that can enhance control of the electronic transport in the channel region of a field effect transistor. Since formation of a wrap-around gate, however, can typically involves multiple additional processing steps, thereby increasing the processing time and cost during manufacturing, some embodiments of the present process can be used to advantageously obtain field effect transistors comprising wrap-around gates.

Figure 11B:
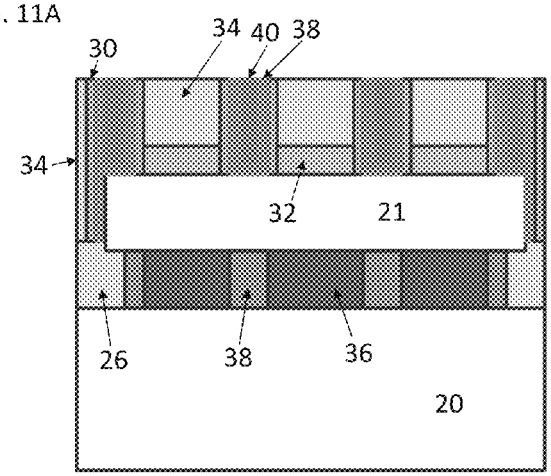
FIG. 11B shows a first cross-sectional view of the structure of FIG. 11A along line b-b.

As shown in FIG. 11B, an alternate embodiment of FIG. 11A can also be fabricated in which the channel structures 21 can be in direct contact ("sitting") on the dielectric layer 38 and surrounded on only three sides by the gate conductor 40. Thus, whereas in some embodiments, the gate dielectric 38 can be a wrap-around gate as in FIG. 11C, in other embodiments as depicted in FIG. 11B, the functional gate can form a contiguous structure that contacts all surfaces of the body region of the channel structure 31 (between the source and drain) except the bottom surface thereof, which bottom surface instead can be in direct contact with the gate dielectric material over the narrow spaces filed by the gate dielectric material.

The gate conductor layer 40 is formed on the gate dielectric layer 38 by a deposition process, such as CVD, plasma-assisted CVD, plating, and/or sputtering, followed by planarization. In one embodiment, the at least one gate conductor layer is composed of metal or a doped semiconductor. Examples of metals that may be employed for the at least one gate conductor layer can include, but is not limited to, W, Ni, Ti, Mo, Ta, Cu, Pt, Ag, Au, Ru, Ir, Rh, and Re, Al, TiN, WN, TaN, TiAlN, TaAlN, and alloys thereof. One example of a doped semiconductor that is suitable for the at least one gate conductor layer is doped polysilicon.

As evident, the semiconductor structure of FIG. 11A comprises: a plurality of elongated channel structures; a plurality of functional gate structures comprising a gate conductor and gate dielectric layer, over the middle portion of each of the elongated channel structures in a direction essentially perpendicular to the elongated channel structures; a plurality of base elements formed from each of a plurality of elongated base layer structures, wherein portions of the elongated have been removed in the direction of the elongated structure; and source regions and drain regions, on opposing sides of the gate structure under a planarized dielectric layer, comprised of III-V semiconductor material. The source and drain regions are separated from the side walls of the gate structure, perpendicular to the direction of the elongated channel structures, by spacer walls, wherein at least a surface portion of each of the channel structures are in direct contact with a functional gate structure, and wherein the source and drain regions are in direct physical and electrical contact with portions of the channel structure, wherein a dielectric layer is stacked over the source regions and drain regions between the spacer walls, and wherein narrow vertical spaces are formed in the dielectric isolation layer under each of the elongated channel structures, which narrow vertical spaces are filled with dielectric gate material, and which narrow vertical spaces are located and contiguous with a plurality of base elements, present in directly stacked relationship with the elongated channel structures, that are situated directly under the source and drain regions.

In some embodiments, in which the FET that is fabricated is an n-type FET, the gate conductor layer can include a metal that is an n-type work function metal layer. As used herein, an "n-type work function metal layer" is a metal layer that effectuates an n-type threshold voltage shift. The term "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TanN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that can be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD). The at least one second gate structure 44 may be formed using deposition, photolithography and etch processes.

The gate conductor 40 can be formed using deposition, photolithography and etch processes. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, a gate conductor layer covered by the photoresist are protected to provide the gate structure 40, while the exposed regions are removed using a selective etching process that removes the unprotected regions. For example, the portion of the gate conductor layer that is present over other areas of the structure 10 can be removed and, following formation of the gate structure 40, the photoresist can be removed.

In view of the previous description, FIGS. 1-11 depict methods for fabricating a field enhance transistor comprising fins or nanowires in which the problem of parasitic capacitance is prevented or reduced. The semiconductor structure 11 can be seen to achieve this by the obtaining a channel structure 21 (or body region thereof), above a substrate 20, for example, as silicon substrate, that is covered by a dielectric isolation layer 26 as well as gate dielectric layer 38.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The descriptions of the various embodiments of the present invention have been presented for purposes of illustration, but are not intended to be exhaustive or limited to embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising
   patterning a semiconductor layer and sacrificial release layer over a substrate, wherein the semiconductor layer is above and in direct contact with the sacrificial release layer, to form a plurality of composite structures, each comprising an elongated channel structure stacked over an elongated sacrificial base structure, the width of the elongated channel structure being greater than the width of the elongated base structure;
   forming a dielectric isolation layer directly on the substrate to a vertical height level that is over the upper most surfaces of the elongated sacrificial base structures but below the upper most surfaces of the elongated channel structures;
   depositing sacrificial gates over the middle portion of each of the elongated channel structures in a direction essentially perpendicular to the elongated channel structures;
   growing source and drain regions on opposed sides of the sacrificial gates;
   removing the sacrificial gates and recessing the dielectric isolation layer to a vertical height level below the lowest surface of the elongated channel structures;
   removing portions of each of the elongated sacrificial base structures so that empty spaces are formed under each elongated channel structure, wherein a narrow vertical empty spaces are formed in the dielectric isolation layer under each elongated channel structure below regions previously occupied by the sacrificial gates.

2. The method of claim 1, further comprising, in a space previously occupied by each sacrificial gate, depositing a layer of gate dielectric material to cover the elongated channel structures and the dielectric isolation layer while also filling each of the narrow vertical empty spaces.

3. The method of claim 1, wherein the semiconductor channel structures form a fin or nanowire for a field effect transistor.

4. The method of claim 1, wherein the elongated channels comprise a doped or undoped silicon-containing material.

5. The method of claim 1, wherein functional gate structures are formed in the spaces previously occupied by the sacrificial gate structures after removing the sacrificial gate structures and recessing the dielectric isolation layer.

6. The method of claim 5, wherein the functional gate structures form a wrap-around gate.

7. The method of claim 1, wherein the plurality of elongated semiconductor channel structures are each vertically separated from a supporting substrate by the dielectric isolation layer and the gate dielectric material, such that the bottom most surface of the semiconductor channel structures are vertically separated from the supporting substrate by a vertical distance equal to the vertical height of the elongated sacrificial base structures used during fabrication.

8. The method of claim 1, wherein the sacrificial release layer and semiconductor layer are consecutively formed by epitaxial deposition, the semiconductor layer being formed subsequently to the sacrificial release layer.

9. The method of claim 1, wherein the sacrificial release layer comprises silicon germanium, the semiconductor layer comprises silicon, and the dielectric isolation layer comprises silicon dioxide.

10. The method of claim 1, further comprising forming source and drain regions on opposing sides of each sacrificial gate.

11. The method of claim 1, wherein portions of each of the elongated sacrificial base structures, within the spacer walls for the previously present sacrificial gates, are etched away to form a row or series of separated base elements each having four vertical walls, which base elements are present directly under the source and drain regions and under, but not directly under, the functional gates.

12. The method of 11, wherein after removing portions of each sacrificial base structure, an empty space is formed directly under each the semiconductor channel structure, between the channel structures and the dielectric isolation layer, in a region between the pair of spacer walls for each sacrificial gate.

13. The method of claim 1 comprising forming a semiconductor structure, comprising forming a semiconductor layer over a sacrificial release layer that is over a silicon substrate;

patterning the semiconductor layer and sacrificial release layers to form a plurality of essentially parallel bottle-necked structures, each comprising an elongated channel structure stacked over an elongated sacrificial base structure, the width of the elongated channel structure being greater than the width of the elongated base structure;

forming a dielectric isolation layer directly on the silicon substrate to a vertical height level that is over the upper most surface of the elongated sacrificial base structures but below the upper most surfaces of the elongated channel structures;

depositing sacrificial gates over the middle portion of each of the elongated channel structures in a direction essentially perpendicular to the elongated channel structures;

growing source and drain regions on opposed sides of the sacrificial gates;

removing the sacrificial gates and recessing the a dielectric isolation layer, in a region previously occupied by the sacrificial gates, to a vertical height level below the lowest surface of the elongated channel structures;

removing portions of each of the elongated sacrificial base structure so that empty spaces are formed under the elongated channel structures in a region previously occupied by the sacrificial gates and narrow vertical empty spaces are formed in the dielectric isolation layer in spaces previously occupied by portions of the elongated sacrificial base structures, wherein a series of separated base elements, remaining from the elongated sacrificial base structure after removing portions thereof, are directly under the source and drain regions;

depositing, in a region previously occupied by each sacrificial gate, a layer of gate dielectric material to cover the elongated channel structures and the dielectric isolation layer while also filling the narrow vertical empty spaces previously occupied by portions of the elongated sacrificial base structures; and forming a conductive gate in a region previously occupied by the sacrificial gate.

14. The method of claim 13, wherein, after depositing the sacrificial gates, wall spacers are formed on the side walls of the sacrificial gates in their direction of elongation, and wherein source and drain regions are formed outside coverage by the sacrificial gate and wall spacers formed thereon.

15. The method of claim 13, wherein after growing source and drain regions, a dielectric layer is formed above, and in direct contact with, the source and drain regions, which said dielectric layer is planarized to the same vertical height level as the sacrificial gates.

16. The method of claim 13, wherein the elongated channel structures are fin structures or nanowires for a field enhanced transistor.

17. A semiconductor structure comprising:

a plurality of elongated channel structures;

a plurality of functional gate structures comprising a gate conductor and gate dielectric layer, over the middle portion of each of the elongated channel structures in a direction essentially perpendicular to the elongated channel structures;

a plurality of base elements formed from each of a plurality of elongated base layer structures, wherein portions of the elongated have been removed in the direction of the elongated structure;

source regions and drain regions, on opposing sides of the gate structure under a planarized dielectric layer, comprised of III-V semiconductor material;

wherein the source and drain regions are separated from the side walls of the gate structure, perpendicular to the direction of the elongated channel structures, by spacer walls;

wherein at least a surface portion of each of the channel structures are in direct contact with a functional gate structure, and wherein the source and drain regions are in direct physical and electrical contact with portions of the channel structure;

wherein a dielectric layer is stacked over the source regions and drain regions between the spacer walls; and wherein narrow vertical spaces are formed in the dielectric isolation layer under each of the elongated channel structures, which narrow vertical spaces are filled with dielectric gate material, and which narrow vertical spaces are located and contiguous with a plurality of base elements, present in directly stacked relationship with the elongated channel structures, that are situated directly under the source and drain regions.

18. The semiconductor structure of claim 17, wherein a dielectric layer is stacked over the source regions and drain regions between the spacer walls.

19. The semiconductor structure of claim 17, wherein the semiconductor channel structures comprise silicon or other semiconductor.

20. A semiconductor intermediate structure used in fabricating a field effect transistor comprising:

a plurality of pairs of gate spacer walls each pair capable of defining a gate region that can be occupied by the functional gate structure of the field effect transistor, which gate spacer walls overlap a middle portion of each of the plurality of elongated channel structures in a direction essentially perpendicular to the elongated channel structures;

a plurality of essentially parallel bottlenecked structures, each comprising an elongated channel structure stacked over an elongated sacrificial base structure, the width of the elongated channel structure being greater than the width of the elongated base structure, wherein the lower surfaces of the bottle necked structures are vertically in direct contact with an underlying substrate;

a dielectric isolation layer directly on the underlying substrate that, in the gate region, has a vertical height level that is above the horizontal plane containing the lower most surfaces of the elongated sacrificial base structures but that is below the horizontal plane containing the lowest most surfaces of the elongated channel structures;

source regions and drain regions on opposing sides of the gate spacer walls, under a planarized dielectric layer, which source and drain regions comprise III-V semiconductor material; and wherein the source and drain regions are separated, by outside surfaces of pairs of gate spacer walls but are in direct contact with the elongated semiconductor channel structures.

* * * * *